United States Patent
Tong et al.

(10) Patent No.: US 6,927,964 B2
(45) Date of Patent: *Aug. 9, 2005

(54) STRUCTURE FOR PREVENTING BURNT FUSE PAD FROM FURTHER ELECTRICAL CONNECTION

(75) Inventors: Ho-Ming Tong, Taipei (TW); Chun-Chi Lee, Kaohsiung (TW); Jen-Kuang Fang, Kaohsiung (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung Hsien (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 62 days.

This patent is subject to a terminal disclaimer.

(21) Appl. No.: 10/604,772

(22) Filed: Aug. 15, 2003

(65) Prior Publication Data

US 2004/0114294 A1 Jun. 17, 2004

Related U.S. Application Data

(63) Continuation of application No. 10/248,803, filed on Feb. 20, 2003, now Pat. No. 6,756,256.

(30) Foreign Application Priority Data

Feb. 27, 2002 (TW) ........................................ 91103526 A

(51) Int. Cl.$^7$ ................................................. H02H 5/00
(52) U.S. Cl. ..................................... 361/104; 361/103
(58) Field of Search ............................... 361/103, 104, 361/58, 100, 18

(56) References Cited

U.S. PATENT DOCUMENTS

| | | | | |
|---|---|---|---|---|
| 6,566,730 B1 | * | 5/2003 | Giust et al. | 257/529 |
| 6,664,142 B2 | * | 12/2003 | Liu | 438/132 |
| 6,667,195 B2 | * | 12/2003 | Liu | 438/132 |
| 6,756,256 B2 | * | 6/2004 | Tong et al. | 438/132 |

* cited by examiner

Primary Examiner—Stephen W. Jackson
(74) Attorney, Agent, or Firm—Jianq Chyun IP Office

(57) ABSTRACT

A semiconductor device with a capability can prevent a burnt fuse pad from re-electrical connection, wherein the semiconductor device includes a bump pad and a fuse pad over a wafer. The fuse pad includes the burnt fuse pad having a gap for electrical isolation. The semiconductor device comprises a dielectric layer, disposed substantially above the burnt fuse pad and filling the gap, and a bump structure, disposed on the bump pad. The foregoing semiconductor device can further comprise a passivation layer, which exposes the bump pad and a portion of the burnt fuse pad. Wherein, the dielectric layer is over the passivation layer, covers the exposed portion of the burnt fuse pad and fills the gap.

9 Claims, 4 Drawing Sheets

US 6,927,964 B2

STRUCTURE FOR PREVENTING BURNT FUSE PAD FROM FURTHER ELECTRICAL CONNECTION

CROSS REFERENCE TO RELATED APPLICATIONS

This application is a continuation of a prior application Ser. No. 10/248,803, filed Feb. 20, 2003 now U.S. Pat. No. 6,756,256, which claims Taiwan application serial No. 91103526, filed on Feb. 27, 2002.

BACKGROUND OF INVENTION

1. Field of the Invention

The present invention is generally related to a method for preventing a burnt fuse pad from further electrical connection, and more particularly to a fabrication method of a bump on a wafer to prevent a burnt fuse pad from further electrical connection.

2. Description of Related Art

Semiconductor devices are usually provided with a fuse system which provides alternative electrical routing depending on whether the fuse wire is burnt or not. Using semiconductor devices as an example, in the fabrication of semiconductor components such as DRAM or SDRAM, due to the high integration of memory cells defects cells are commonly found. As the integration level is continuously increasing, the production yield of these semiconductor devices is lowered. Therefore in order to increase the yield of the fabrication of semiconductor devices, prior art utilizes redundancy circuit technology to improve the yield of the fabrication of semiconductor devices.

In the fabrication process of semiconductor components, besides the main memory cell array that is originally used for storing two bit data, a redundancy memory cell array is additionally fabricated in the peripheral region of the main memory cell array for replacing the defect memory cells during the fabrication process. The main memory cell array and the redundancy memory array are connected via the fuse pads. Therefore when a defect memory cell is being recovered, laser will burn the central region of the fuse pad to allow the redundancy memory cell array to replace the main memory cell array. Oppositely if no defect memory cell recovery is required, no laser burning is applied to the central region of the fuse pad.

After the memory chip is tested and recovered, the chip must undergo a packaging process. Prior art provides a kind of memory chip packaging such as small out-line package (SOP) which first adheres a memory chip onto a leadframe and then by means of wire bonding electrically connects the bonding pads of the chip and one end of the inner leads by conductive wires. Afterwards, a molding compound is deposited to encapsulate the chip, the conductive wires, and a part of the leadframe. The memory chip uses the outer lead which are located outside the leadframe as the signal input and output terminal. It is to be noted that when the memory chip is being recovered, a gap that is created by the laser burning the central region of the fuse pads is entirely filled up by the molding material during the packaging process.

In order for these chips with fuse pads to work with flip chip (F/C) packaging method, bumps must be formed on the bump pads of the chip and they must be connected to a substrate via a carrier. It is to be noted that before forming bumps on the bumps pads of the chip, an under ball metallurgy (UBM) layer is usually first formed on the bump pads by either evaporation, sputtering, or electroplating to increase the connectivity between the bumps and the bump pads. Furthermore in the process of forming UBM layer, a part of the conductive material is still left over inside the gaps of the burnt fuse pads which cause electrical conductivity of originally burnt fuse pads. As a result, the original chip after recovery process loses its effect.

SUMMARY OF INVENTION

The present invention provides a structure for preventing the burnt fuse pads from further electrical connection, which is suitable in the process of bumps on the bumps pads of a wafer. An insulating material is deposited into the gap caused by the burnt fuse pads. This results in that the burnt fuse pads on the two sides of the gap are electrically insulated to retain the effect of the original chip recovery process and to allow bumps to be formed on the bump pads of the wafer.

The present invention provides a semiconductor device with a capability for preventing a burnt fuse pad from re-electrical connection, wherein the semiconductor device includes a bump pad and a fuse pad over a wafer. The fuse pad includes the burnt fuse pad having a gap for electrical isolation. The semiconductor device comprises a dielectric layer, disposed substantially above the burnt fuse pad and filling the gap, and a bump structure, disposed on the bump pad. The foregoing semiconductor device can further comprise a passivation layer, which exposes the bump pad and a portion of the burnt fuse pad. Wherein, the dielectric layer is over the passivation layer, covers the exposed portion of the burnt fuse pad and fills the gap.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

First Embodiment

The present invention provides a method for preventing burnt fuse pads from further electrical connection, please refer to FIGS. 1A to 1E, wherein the flow diagram of the bump fabrication process according to the first embodiment of the present invention is shown.

Figure 1A:
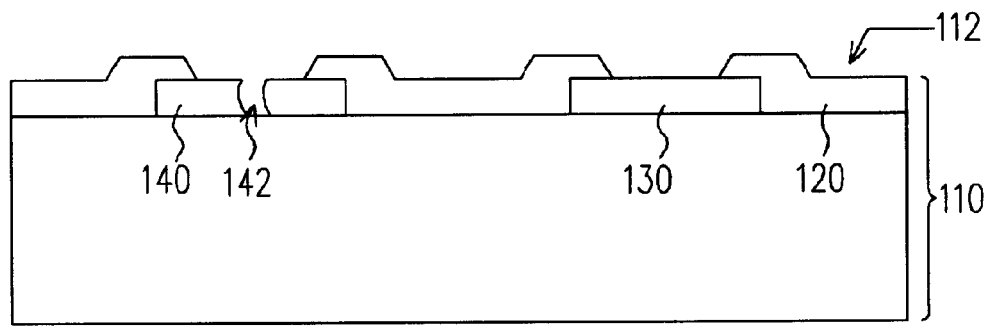
FIGS. 1A to 1E are schematic sectional diagrams of the flow diagram showing the bump fabrication process according to the first embodiment of the present invention.

As illustrated in FIG. 1A, a passivation layer 120, a plurality of bump pads 130 (only one is shown in the diagram), and a plurality of fuse pads 140 (only one is shown in the diagram) are located on an active surface 112 of a wafer 110, where the passivation layer 120 exposes the bump pads 130 and the fuse pads 140 on the active surface 112 of the wafer 110. It is to be noted that after the singulation of the wafer 110, the resulting semiconductor memory chips or other chips possess the fuse pad design which provides electrical insulation to the fuse pads 140 on the two sides of the gap 142 formed by laser burning during the patterning of the central region of the fuse pads 140.

Figure 1B:
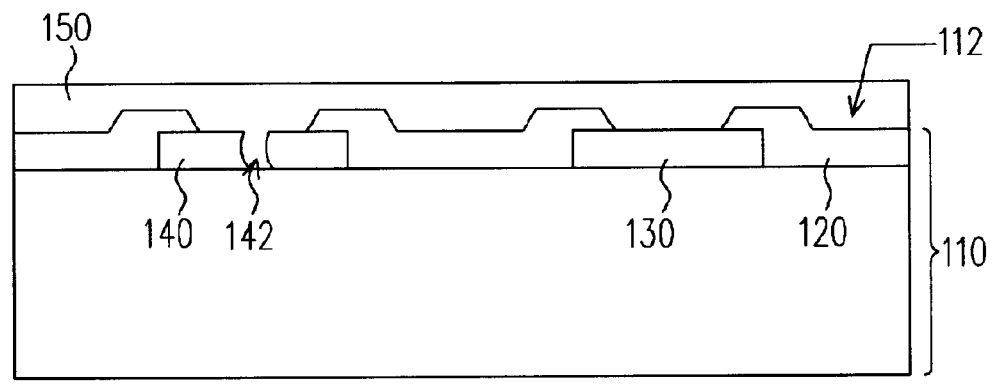

As illustrated in FIG. 1B, following a dielectric layer 150 is completely formed on the active surface 112 of the wafer 110 covering the passivation layer 120, the bump pads 130, and the fuse pads 140, wherein the dielectric layer 150 fills up the gap 142 of the fuse pads 140 for providing electrical insulation to the two sides of the fuse pads 140. The method of forming the dielectric layer 150 on the active surface 112 of the wafer 110 comprises spin coating and the material of the dielectric layer 150 comprises Benzocyclobutene (BCB), Poly-Imide (PI), Nitride, $SiN_3$, Spin-On Glass (SOG), Spin-On Dielectric (SOD), $SiO_x$, $SiO_2$, or the like insulating material.

Figure 1C:
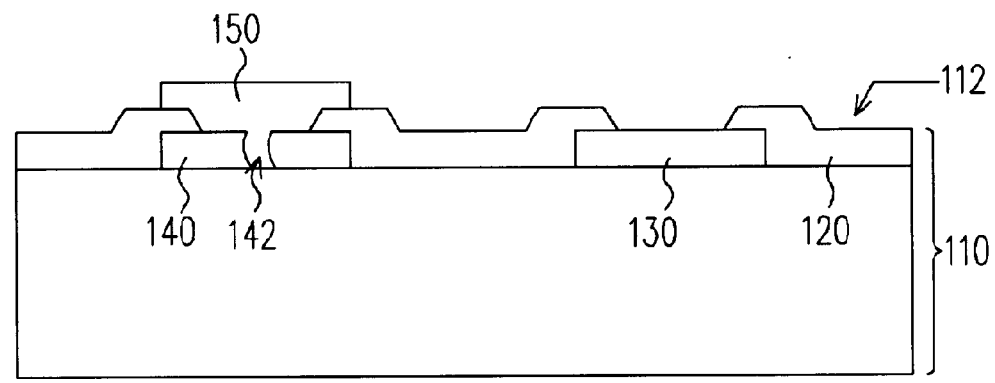

As illustrated in FIG. 1C, the dielectric layer 150 is patterned so as to remove the part of the dielectric layer 150 that is not above the fuse pads 140 and to remain the part of the dielectric layer 150 that is covering the fuse pads 140. Therefore the patterned dielectric layer 150, besides filling up the gap 142 of the fuse pads 140, also covers the fuse pads 140. The method of removing the dielectric layer comprises wet etching or dry etching, and dry etching can be for example plasma etching.

Figure 1D:
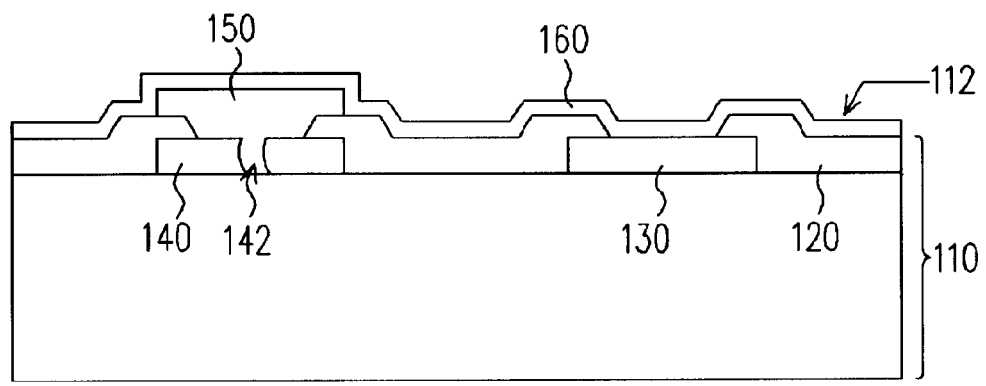
Figure 1E:
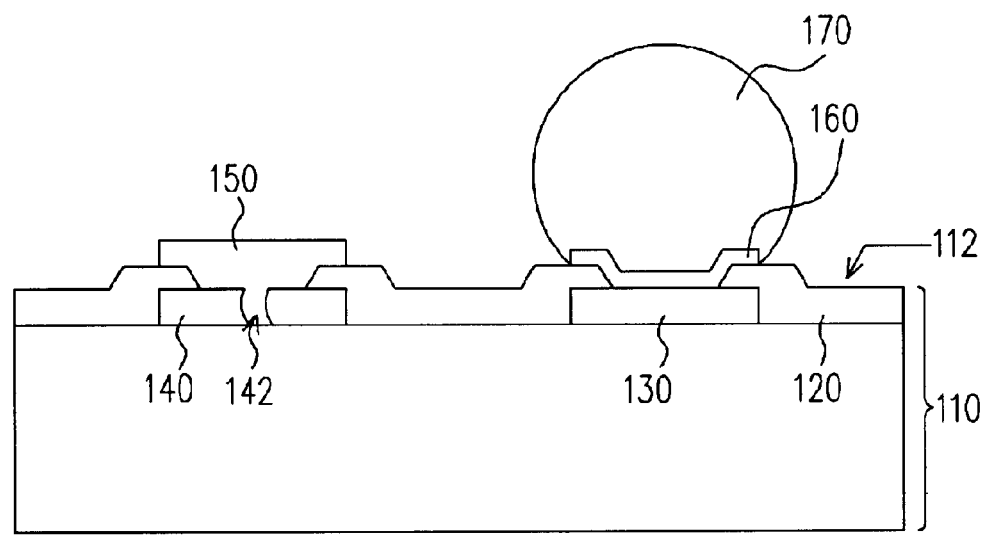

As illustrated in FIG. 1D, the UBM layer 160 are formed on the active surface 112 of the wafer 110 by evaporation, sputtering, electroplating, and the like. Due to the dielectric layer 150 covering the fuse pads 140, the material leftover from the UBM layer 160 is prevented from leaking into the gap 142 of the fuse pads 140 and therefore the two sides of the fuse pads 140 remain electrically insulated. Finally as illustrated in FIG. 1E, the UBM layer 160 are patterned so that the UBM layer 160 only cover bump pads 130 and thereafter the bumps 170 are formed on the UBM layer 160.

Second Embodiment

The second embodiment differs from the first embodiment for the distribution in the region of the dielectric layer on the active surface of the wafer. In order to illustrate the method for preventing burnt fuse pads from further electrical connection of the present invention, please referring to FIGS. 2A to 2E, which are schematic sectional diagrams of the flow diagram showing the bumps fabrication process according to the second embodiment of the present invention.

Figure 2A:
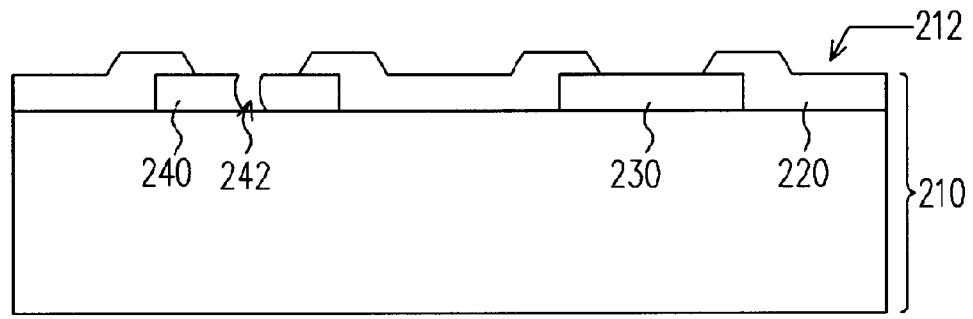
FIGS. 2A to 2E are schematic sectional diagrams of the flow diagram showing the bump fabrication process according to the second embodiment of the present invention.

As illustrated in FIG. 2A, a passivation layer 220, a plurality of bump pads 230 (only one is shown in the diagram) and a plurality of fuse pads 240 (only one is shown in the diagram) are located on an active surface 212 of a wafer 210. Wherein, the passivation layer 220 exposes the bump pads 230 and the fuse pads 240 on the active surface 212 of the wafer 210. It is to be noted that the wafer 210, after cutting, forms the semiconductor memory chips or other chips, including the fuse pad design. The central region of the fuse pad 240s, as shown in FIG. 2A, is burnt by laser, and a gap 242 is thereby formed therein, so as to electrically isolate the two sides of the fuse pads 240.

Figure 2B:
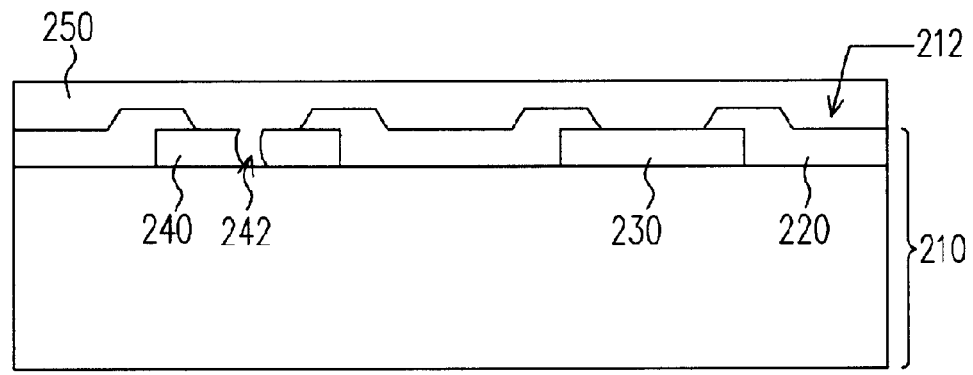

As illustrated in FIG. 2B, following a dielectric layer 250 is completely formed on the active surface 212 of the wafer 210 covering the passivation layer 220, the bump pads 230, and the fuse pads 240, wherein the dielectric layer 250 fills up the gap 242 of fuse pads 240 for providing electrical insulation to the two sides of the fuse pads 240. The method of forming the dielectric layer 250 on the active surface 212 of the wafer 210 comprises spin coating and the material of the dielectric layer comprises benzocyclobutene (BCB) or the like material.

Figure 2C:
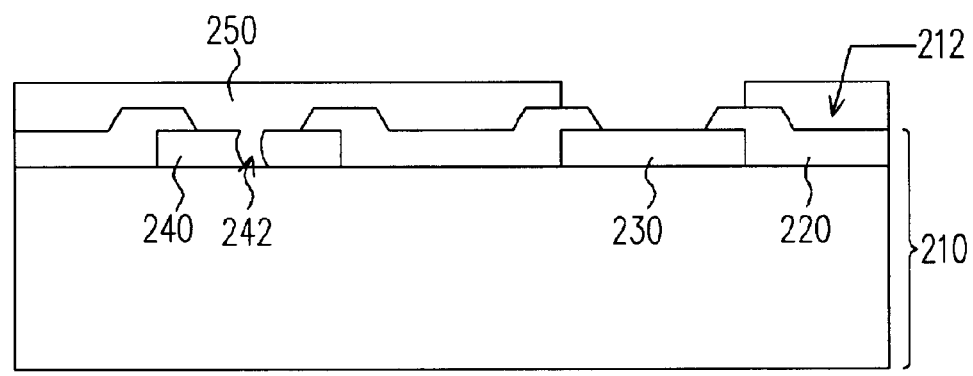

As illustrated in FIG. 2C, the dielectric layer 250 is patterned to remove the part of the dielectric layer 250 above the bump pads 230 for exposing the bump pads 230 and to remain the rest of the dielectric layer 250 on the active surface 212 of the wafer 210. Therefore the patterned dielectric layer 250, besides filling up the gap 242 of the fuse pads 240, also covers the fuse pads 240. Wherein the method of removing the dielectric layer comprises wet etching or dry etching, and dry etching can be for example plasma etching.

Figure 2D:
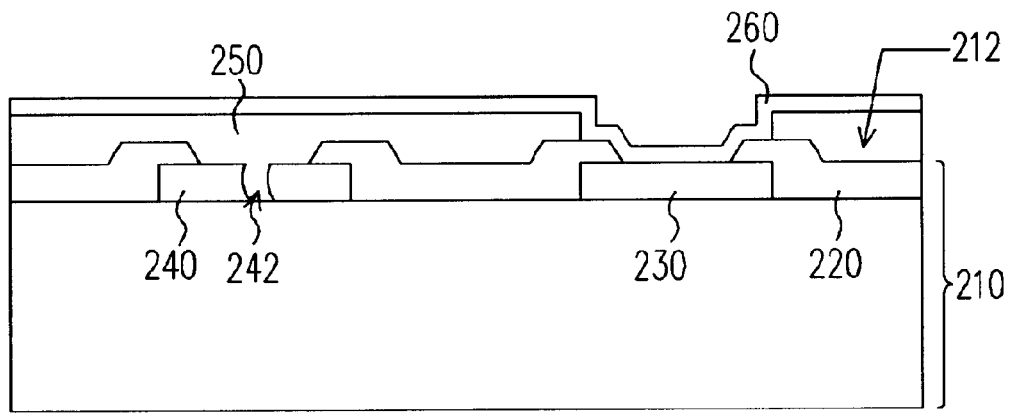
Figure 2E:
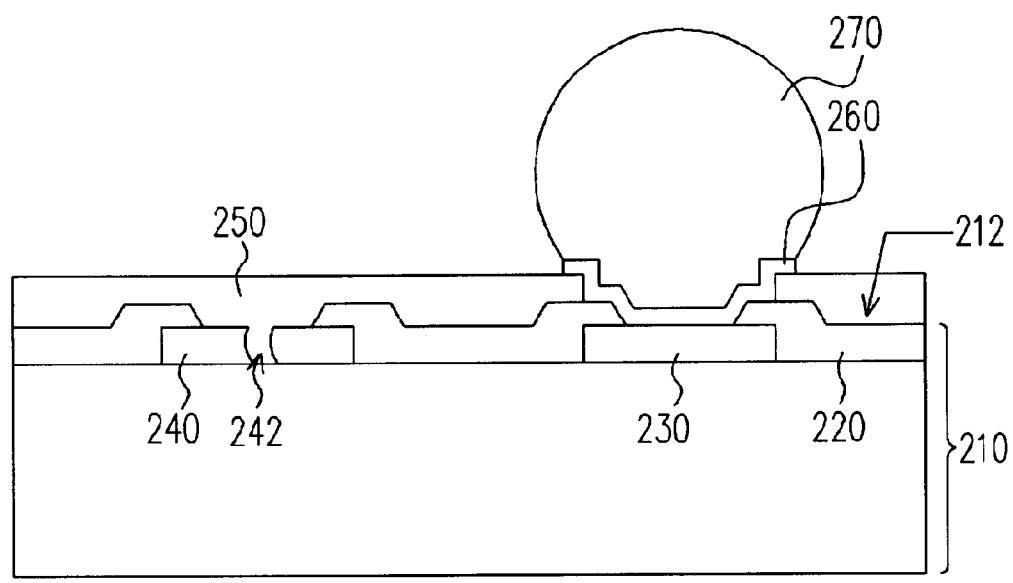

As illustrated in FIG. 2D, the UBM layer 260 are formed on the active surface 212 of the wafer 210 by evaporation, sputtering, electroplating, and the like. Due to the dielectric layer 250 covering the fuse pads 240, the material from the UBM layer 260 is prevented from leaking into the gap 242 of the fuse pads 240 and therefore the two sides of the fuse pads 240 remain electrically insulated. Finally as illustrated in FIG. 2E, the UBM layer 260 are patterned so the UBM layer 260 only cover bump pads 230 and the bumps 270 are formed on the UBM layer 260.

It is to be noted if the packaged chip is coupled to a carrier, the coefficient of thermal expansion (CTE) of the chip and the carrier are different. Therefore the material of the dielectric layer is not restricted to be a solely insulating material but can also be an elastic insulating material such as Benzocyclobutene (BCB) or other insulating material having elastic properties to buffer the thermal stress. The thermal stress usually is caused by the different CTE of the chip and the carrier.

The second embodiment of the present invention first covers the dielectric layer over the fuse pads before the formation of the bumps on the wafer, especially covering the burnt fuse pads. This effectively prevents subsequent fabrication process such as the fabrication process of UBM layer from leaking unnecessary residual conductive material onto the central region or inside the gap of the fuse pads to ensure the two sides of the burnt fuse pads are electrically insulted. Furthermore after the removal of the dielectric layer covering the bump pads, a large portion of leftover dielectric layer having elastic properties buffers the thermal stress caused by different CTEs of the chip and the carrier.

Summarizing the above, the present invention provides a method for preventing burnt fuse pads from further electrical connection by first covering the burnt fuse pads with a dielectric layer before the formation of the bumps on the bump pads of the wafer. The residual conductive material from the formation of the UBM layer is prevented from leaking into the gap of the burnt fuse pads which renders the chip recovery process by using fuse pads ineffective. Furthermore if the dielectric layer possess elastic properties, due to the large portion of the dielectric layer remaining after the remove of some over the bump pads, the dielectric layer buffers the thermal stress caused by the different coefficient of thermal expansions of the chip and the carrier.

It will be apparent to those skilled in the art that various modifications and variations can be made to the structure and method of the present invention without departing from the scope or spirit of the present invention. In view of the foregoing description, it is intended that the present invention covers modifications and variations of this invention provided they fall within the scope of the following claims and their equivalents.

What is claimed is:

1. A semiconductor device, the semiconductor device comprising:

a bump pad and a fuse pad over a wafer, wherein the fuse pad includes a burnt fuse pad having a gap for electrical isolation;

a dielectric layer, disposed substantially above the burnt fuse pad and filling the gap; and a bump structure, disposed on the bump pad.

2. The semiconductor device of claim 1, further comprising a passivation layer, which exposes the bump pad and a portion of the burnt fuse pad, wherein the dielectric layer is over the passivation layer, covers the exposed portion of the burnt fuse pad, and fills the gap.

3. The semiconductor device of claim 1, wherein the dielectric layer includes one selected from the group consisting of Benzocyclobutene (BCB), Poly-Imide (PI), Nitride, $SiN_3$, Spin-On Glass (SOG), Spin-On Dielectric (SOD), $SiO_x$, and $SiO_2$.

4. The semiconductor device of claim 1, wherein the bump structure includes:

an under ball metallurgy (UBM) layer to cover the exposed bump pad; and a bump on the UBM layer.

5. The semiconductor device of claim 1, wherein the semiconductor device comprises a memory device.

6. A protection structure for preventing a burnt fuse pad from re-electrical connection in a semiconductor device, the semiconductor device includes a bump pad, a bump structure on the bump pad, and a fuse pad over a wafer, wherein the fuse pad includes the burnt fuse pad having a gap for electrical isolation, the protection structure comprising:

a dielectric layer, disposed substantially above the burnt fuse pad and filling the gap of the burnt fuse pad.

7. The protection structure of claim 6, wherein the dielectric layer includes one selected from the group consisting of Benzocyclobutene (BCB), Poly-Imide (PI), Nitride, $SiN_3$, Spin-On Glass (SOG), Spin-On Dielectric (SOD), $SiO_x$, and $SiO_2$.

8. The protection structure of claim 6, further comprising a passivation layer, which exposes the bump pad and a portion of the burnt fuse pad, wherein the dielectric layer is over the passivation layer, covers the exposed portion of the burnt fuse pad, and fills the gap.

9. The protection structure of claim 6, wherein the semiconductor device includes a memory device.

* * * * *